United States Patent [19]

Linder

[11] Patent Number: 5,313,113
[45] Date of Patent: May 17, 1994

[54] SAMPLE AND HOLD CIRCUIT WITH FULL SIGNAL MODULATION COMPENSATION USING BIPOLAR TRANSISTORS OF SINGLE CONDUCTIVITY TYPE

[75] Inventor: Lloyd F. Linder, Agora Hills, Calif.

[73] Assignee: Hughes Aircraft Company, Los Angeles, Calif.

[21] Appl. No.: 870,369

[22] Filed: Apr. 17, 1992

[51] Int. Cl.$^5$ ............................................. H03K 5/24
[52] U.S. Cl. .................................. 307/353; 307/257; 307/494; 307/578
[58] Field of Search ............... 307/352, 353, 440, 482, 307/494, 578, 257, 317.1, 321; 328/208

[56] References Cited

U.S. PATENT DOCUMENTS

| | | | |
|---|---|---|---|
| 3,179,817 | 4/1965 | Bounsall | 307/257 |
| 3,721,829 | 3/1973 | Benson | 307/352 |
| 4,518,921 | 5/1985 | Logan | 307/353 |
| 4,540,902 | 9/1985 | Ishikawa | 307/352 |
| 4,659,945 | 4/1987 | Metz | 307/353 |
| 4,879,478 | 11/1989 | Gershon | 307/353 |
| 5,124,576 | 6/1992 | Jensen | 307/353 |

*Primary Examiner*—William L. Sikes
*Assistant Examiner*—My-Trang Nu Ton
*Attorney, Agent, or Firm*—Georgann S. Grunebach; Terje Gudmestad; W. K. Denson-Low

[57] ABSTRACT

A diode bridge (12) includes a plurality of diodes (D1,D2,D3,D4) for coupling an input voltage signal (Vin) through a resistor (RH) to a holding capacitor (CH) for sampling when the diodes (D1,D2,D3,D4) are forward biased, and uncoupling the voltage signal (Vin) from the capacitor (CH) for holding when the diodes (D1,D2,D3,D4) are reverse biased. A constant current drain (S1) causes a constant bias current (IBIAS) to flow out of the bridge (12) through first and second bias current nodes (N1,N2) to a voltage source (VEE). The nodes (N1,N2) are also connected through current source resistors (R1,R2) to a voltage source (VCC). A first current regulator (72) is bootstrapped to the input signal (Vin) and regulates first and second bias currents flowing into the nodes (N1,N2) to constant values (IBIAS/2) to compensate for resistive current source modulation. A second current regulator (92) is also bootstrapped to the input signal (Vin) and regulates bias current flowing through the resistor (RH) into the junction (20) between the resistor (RH) and the capacitor (CH) to a constant value (IBIAS/4) to compensate for output slew current modulation.

30 Claims, 9 Drawing Sheets

SAMPLE AND HOLD CIRCUIT WITH FULL SIGNAL MODULATION COMPENSATION USING BIPOLAR TRANSISTORS OF SINGLE CONDUCTIVITY TYPE

BACKGROUND OF THE INVENTION

1. Field of the Invention

The present invention generally relates to the field of electronic waveform sampling circuits, and more specifically to a sample and hold circuit which compensates for signal modulation by resistive current sources and output slew currents using bipolar transistors of a single conductivity type.

2. Description of the Related Art

Sample and hold circuits charge a holding element, which is usually a capacitor, to the instantaneous amplitude of an analog input signal during a tracking or sampling interval, and then uncouple the signal from the capacitor during a holding interval. The sampled voltage which is held by the capacitor is typically applied to an analog-to-digital converter which produces a corresponding digital value which is stored in a random access memory of a waveform processing unit. A set of stored digital values obtained at increments of a sampled waveform constitutes a digital approximation of the analog signal, and can be analyzed or processed using a variety of known algorithms in accordance with a particular application.

FIG. 1 illustrates a basic prior art class A sample and hold circuit 10 including a switchable diode bridge 12 such as described in U.S. Pat. No. 4,659,945, entitled "SAMPLING BRIDGE", issued Apr. 21, 1987 to A. Metz. The bridge 12 has a first bias current node N1 and a second bias current node N2. The anodes of diodes D1 and D3 are connected to the node N2, whereas the cathodes of diodes D2 and D4 are connected to the node N1. The cathodes of the diodes D1 and D3 are connected to the anodes of the diodes D2 and D4 respectively. An analog input voltage signal Vin which is to be sampled is applied to the junction of the diodes D1 and D2 which constitutes an input 14. An output signal Vout appears at the junction of the diodes D3 and D4, which constitutes an output 16, and is applied to a holding circuit 18 including a charging resistor RH and an integrating or holding capacitor CH. A junction 20 is defined between the resistor RH and capacitor CH.

The diode bridge 12 further includes a diode D5 having a cathode connected to the node N2, and a diode D6 having an anode connected to the node N1. The anode of the diode D5 is connected to the cathode of the diode D6. A unity-gain replica of the output signal Vout is fed back through a buffer amplifier A1 to the junction of the diodes D5 and D6 and designated as a bootstrap bias voltage VBS. The diodes D5 and D6 are connected in anti-parallel relation to the diodes D1, D2, D3 and D4.

An NPN bipolar sampling transistor Q2 has a collector connected to the node N1 and an emitter connected to a constant current drain S1. A signal Vsample for selecting or commanding a tracking or sampling mode of operation is applied to the base of the transistor Q2. An NPN bipolar holding transistor Q1 has a collector connected to the node N2 and an emitter connected to the drain S1. A signal Vhold for selecting or commanding a holding mode of operation is applied to the base of the transistor Q1. The drain S1 causes a predetermined constant bias current IBIAS to flow out of the bridge 12 through the node N1 or N2 and whichever transistor Q1 or Q2 is turned on into a voltage source VEE.

A first current source resistor R1 is connected between a voltage source VCC, which produces a voltage higher than the voltage VEE, and the node N2. Diodes D7 and D9 have anodes connected through a second current source resistor R2 to the voltage source VCC and cathodes connected to the anodes of diodes D8 and D10 respectively. The cathodes of the diodes D8 and D10 are connected to the node N1.

The diodes D7, D8, D9 and D10 are connected in the same configuration as the diodes D1, D2, D3 and D4 respectively and enable the resistor R2 to have the same resistance as the resistor R1 and be connected to the same voltage source VCC. Although not specifically illustrated, it is within the scope of the invention to connect the resistors R1 and R2 to different voltage sources.

The circuit 10 is operated in sampling mode by applying the sampling signal Vsample to the transistor Q2 and removing the holding signal Vhold from the transistor Q1. The transistor Q2 is turned on, thereby connecting the node N1 to the drain S1, whereas the transistor Q1 is turned off, thereby disconnecting the node N2 from the drain S1. The diodes D1, D2, D3 and D4 are forward biased, thereby coupling the signal Vin therethrough to the capacitor CH which charges through the resistor RH to the instantaneous value of the signal Vin to produce the signal Vout. The diodes D5 and D6 are reverse biased, and do not pass signal or bias current therethrough.

The bias current IBIAS flows out of the circuit 10 through the drain S1. Under theoretically ideal conditions, half of this current, IBIAS/2, flows through the resistor R1, node N2, diodes D1, D2, D3 and D4, node N1 and transistor Q2 to the drain S1 to forward bias the diodes D1, D2, D3 and D4 and couple the signal Vin to the capacitor CH. Another half IBIAS/2 of the bias current IBIAS flows through the resistor R2, diodes D7, D8, D9 and D10, node N1 and transistor Q2 to the drain S1.

The circuit 10 is operated in holding mode by applying the holding signal Vhold to the transistor Q1 and removing the sampling signal Vsample from the transistor Q2. The transistor Q1 is turned on, thereby connecting the node N2 to the drain S1, whereas the transistor Q2 is turned off, thereby disconnecting the node N1 from the drain S1. The diodes D5 and D6 are forward biased by the bootstrap bias voltage Vbs, thereby causing the diodes D1, D2, D3 and D4 to be reverse biased and not pass signal or bias current therethrough, such that the signal Vin is uncoupled from the capacitor CH.

The current IBIAS flows out of the circuit 10 through the drain S1 in holding mode as it does in sampling mode. Half of this current, IBIAS/2, flows through the resistor R2, diodes D7, D8, D9 and D10, node N1, diodes D5, and D6, node N2 and transistor Q1 to the drain S1 to forward bias the diodes D5 and D6, reverse bias the diodes D1, D2, D3 and D4 and thereby uncouple the signal Vin from the capacitor CH. Another half of this current, IBIAS/2, flows through the resistor R1, node N2 and transistor Q1 to the drain S1.

The diodes D5 and D6 must have a forward voltage drop which is larger than the forward voltage drop of the diodes D1, D2, D3 and D4 in order to cause the diodes D1, D2, D3 and D4 to be reverse biased when the diodes D5 and D6 are forward biased. Where a particular application must be implemented by diodes of a single type, the required effect can be produced by substituting two or more series diodes for each of the diodes D5 and D6, although not specifically illustrated.

Sample and hold circuits are often required to operate at very high speeds. Complementary bipolar integrated circuit fabrication techniques which enable transistors of both NPN and PNP conductivity types to be formed are currently limited in that the circuits produced by these techniques are only capable of operation at low speeds. For this reason, prior art high speed sample and hold circuits such as illustrated in FIG. include only resistors and bipolar devices of a single conductivity type, usually NPN, and are vulnerable to tracking errors caused by non-linear signal modulation.

As described above, under theoretically ideal conditions, bias currents, each having a value of IBIAS/2, flow into the bridge 12 through the resistors R1 and R2 and the nodes N2 and N1 respectively in sampling mode. Under real conditions, however, these bias currents vary in accordance with the magnitude of the signal Vin and produce non-linear errors in the output signal Vout. This effect is known as "resistive current source modulation".

A second source of tracking non-linearity results from the fact that the holding circuit 18 has finite impedance. The resistance of the resistor RH and the capacitance of the capacitor CH determine the noise bandwidth in a class A sample and hold circuit. The holding circuit 18 constitutes a load impedance which must be driven by the bridge 12 over the entire frequency range of the signal Vin. In driving the load impedance, the bridge 12 must source and sink different drive currents into the capacitor CH through the resistor RH and junction 20 which are slew rate (rate of change of the signal Vin) dependent. This drive or slew current also modulates the output signal Vout, and the effect is known as "output slew current modulation".

These two sources of signal modulation have limited the speed, linearity and resolution of class A sample and hold circuits and restricted their use to relatively low performance applications.

SUMMARY OF THE INVENTION

In a sample and hold circuit embodying the present invention, a diode bridge includes a plurality of diodes for coupling an input voltage signal through a charging resistor to a holding capacitor for sampling when the diodes are forward biased, and uncoupling the voltage signal from the capacitor for holding when the diodes are reverse biased.

A constant current drain causes a constant bias current to flow out of the bridge through first and second bias current nodes to a first voltage source. The nodes are also connected through current source resistors to a second voltage source.

A first current regulator is bootstrapped to the input signal and regulates first and second bias currents flowing into the nodes to constant values to compensate for resistive current source modulation. The first regulator includes a transconductance amplifier which is responsive to the input signal, and an NPN bipolar transistor which is connected in series with the current source resistors and controlled by the amplifier to regulate the bias current flow into the nodes. The transistor may be connected in series or in parallel with the bridge.

A second current regulator is also bootstrapped to the input signal and regulates a bias current flowing through the charging resistor into the junction between the charging resistor and the capacitor to a constant value to compensate for output slew current modulation. The second regulator also includes a transconductance amplifier which is responsive to the input signal, and an NPN transistor which is connected to the junction of the charging resistor and holding capacitor and controlled by the amplifier to regulate the current flow into the junction.

The present invention provides "full signal modulation compensation" in a class A sample and hold circuit by eliminating signal modulation caused by resistive current source modulation and output slew current modulation. This enables the present circuit to be fabricated with conventional NPN bipolar transistor technology, and be capable of operating with high speed, linearity and resolution in sampling mode.

The non-linear pedestal in sampling mode (residual charge in the holding capacitor when switching between sampling and holding modes) is inherently low in an all NPN sample and hold circuits since the diodes and transistors are all of the same conductivity type and size. In contrast, the NPN and PNP devices in a complementary bipolar circuit do not match as well, and the non-linear pedestal is higher. The present invention improves on the conventional all NPN circuit. Since no transistors modulate, the performance is linear. Since the output slew current is eliminated, the non-linear pedestal is reduced even further.

Although the preferred conductivity type for the transistors in the present sample and hold circuit is NPN, the invention can also be embodied using all PNP devices.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
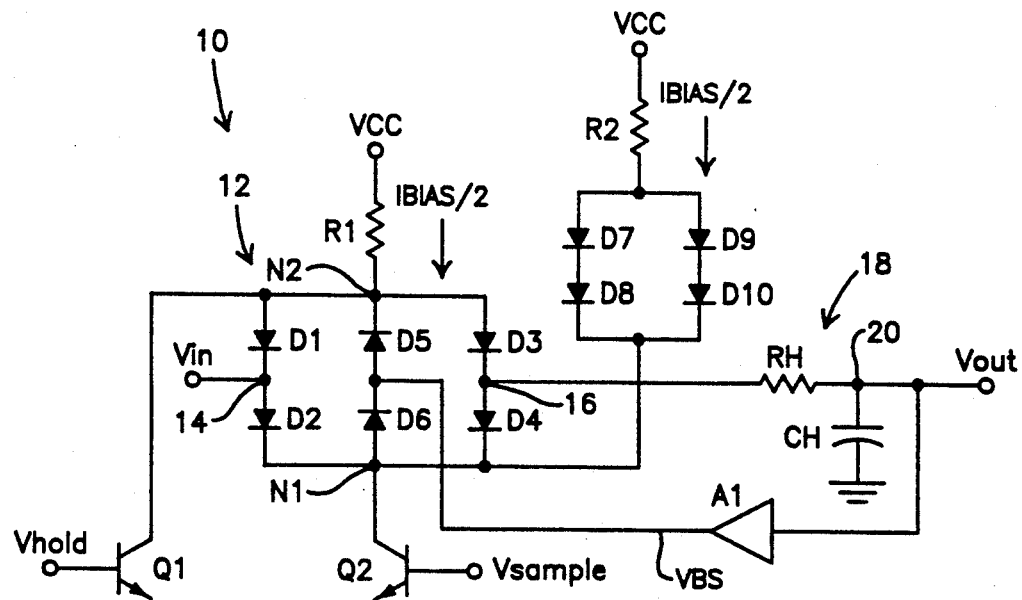
FIG. 1 is an electrical schematic diagram illustrating a prior art sample and hold circuit.
Figure 2:
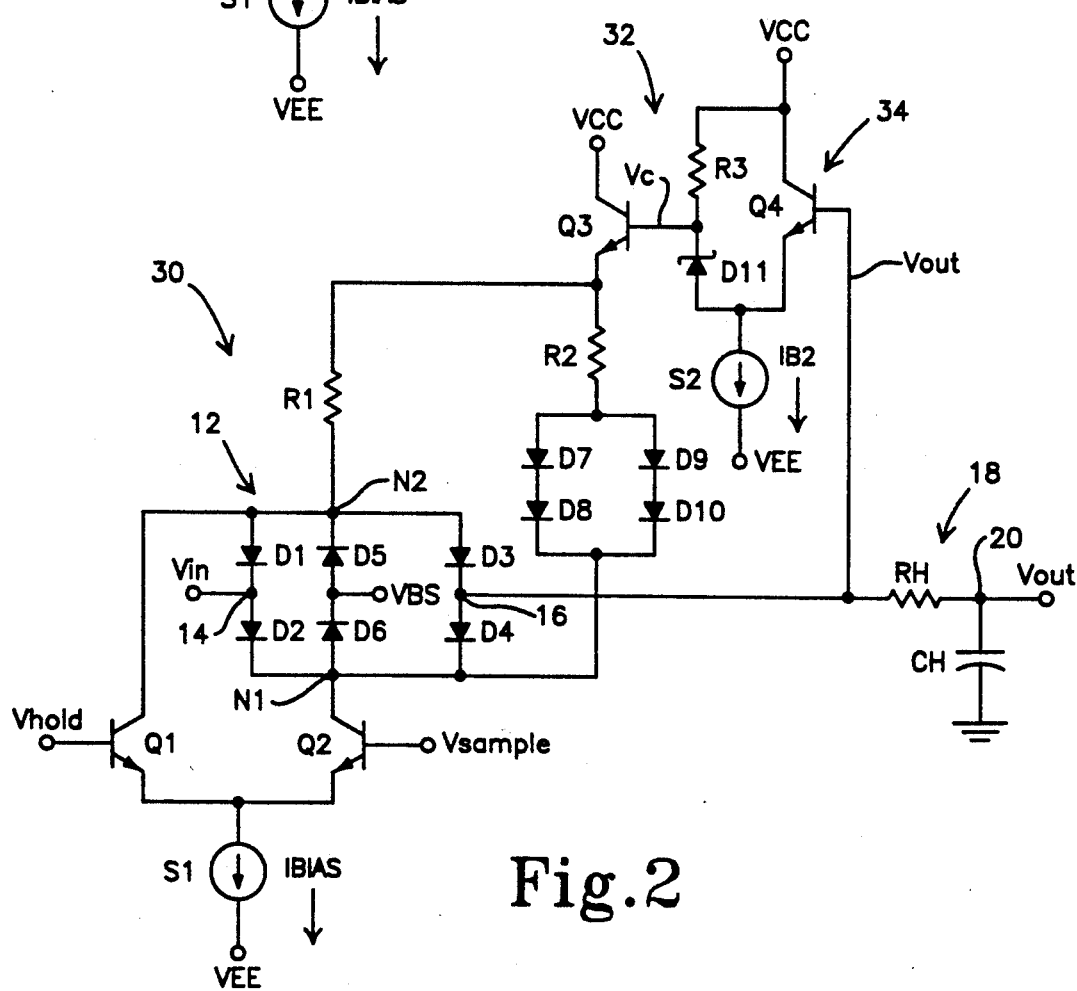
FIGS. 2 to 7 are electrical schematic diagrams illustrating alternative embodiments of a sample and hold circuit embodying the present invention including compensation for resistive current source modulation.

FIG. 2 illustrates a class A sample and hold circuit 30 embodying the present invention, in which like elements are designated by the same reference numerals used in FIG. 1. In addition to the elements of the conventional circuit 10, the circuit 30 includes a bootstrap current regulator 32 for improving tracking linearity by compensating for resistive current source modulation. The regulator 32 includes an NPN bipolar transistor Q3 having a collector connected to the voltage source VCC and an emitter connected to the upper ends of the resistors R1 and R2. It will be noted that the transistor Q3 is connected in series with the resistors R1 and R2 and also in series with the bridge 12.

The regulator 32 further includes a transconductance amplifier 34 for adjustably controlling current flow through the transistor Q3. The amplifier 34 includes an NPN bipolar transistor Q4 having a base connected to the output 16 of the bridge 12 and a collector connected to the voltage source VCC. The emitter of the transistor Q4 is connected to a constant current drain S2 which sinks a current IB2. The anode of a zener diode D11 is connected to the drain S2. A resistor R3 is connected between the cathode of the diode D11 and the voltage source VCC. The cathode of the diode D11 is connected to the base of the transistor Q3.

The amplifier 34 adds a first offset voltage V01 to the voltage Vout to produce an output control voltage Vc such that Vc = Vout + V01

Since the transistor Q4 is connected as an emitter follower, its emitter voltage is one diode drop Vbe (approximately 0.8 volts) below its base voltage, or Vout − Vbe. The reverse voltage drop of the zener diode D11 is selected to equal V01 + Vbe. The control voltage Vc which appears at the cathode of the diode D11 and is applied to the base of the transistor Q3 is therefore Vc = (Vout − Vbe) + (V01 + Vbe) = Vout + V01.

In sampling mode, the voltage at the node N2 is one diode drop Vbe (approximately 0.8 volts) above Vout and the voltage at the node N1 is one diode drop Vbe below Vout. Since the transistor Q3 is connected as an emitter follower, its emitter voltage is one diode drop Vbe below its base voltage, or Vc − Vb. The resistors R1 and R2 each have a resistance RV, and the offset voltage V01 is predetermined such that (V01 − 2 Vbe)/RV = IBIAS/2

The current flow through each of the resistors R1 and R2 is equal to the voltage thereacross divided by its resistance. The voltage at the upper ends of the resistors R1 and R2 which are connected to the emitter of the transistor Q3 is Vc − Vbe. The voltage at the lower end of the resistor R1 which is connected to the node N2 is Vout + Vbe. The voltage across the resistor R1 is therefore Vc − (Vout + 2 Vbe), or V01 − 2 Vbe. The current flowing through the resistor R1 into the node N2 is therefore (V01 − 2 Vbe)/RV = IBIAS/2.

The voltage at the node N1 is Vout − Vbe. The voltage at the lower end of the resistor R2 which is connected to the anodes of the diodes D7 and D9 is two diode drops above this value, or Vout + Vbe, the same at the node N2. Thus, the current flow through the resistor R2 is also IBIAS/2. The operation in essentially similar in holding mode since the output voltage Vout is applied to the base of the transistor Q4 through the resistor RH.

The arrangement of the bootstrap transconductance amplifier 34 in combination with the transistor Q3 causes the current IBIAS/2 to flow into the bridge 12 through the nodes N1 and N2 for all values of the input voltage Vin. Since the output voltage Vout substantially tracks and is equal to the input voltage Vin, the voltage at the node N2 (lower end of the resistors R1 and R2) will always be Vout + Vbe Vbe and the voltage at the emitter of the transistor Q3 (upper end of the resistors R1 and R2) will always be Vout + V01 − Vbe. Thus, the voltage across the resistors R1 and R2 will always be V01 − 2 Vbe and the current through each of the resistors R1 and R2 (flowing into bridge 12 through the nodes N1 and N2) will always be (V01 − 2 Vbe)/RV = IBIAS/2.

The regulator 32 bootstraps the bias currents flowing through the current source resistors R1 and R2 into the bridge 12 through the nodes N2 and N1 respectively to the signal Vin such that the bias currents are maintained constant at IBIAS/2. Thus, the output voltage Vout is not modulated by changes in bias current, and the goal of providing compensation for resistive current source modulation is achieved.

The invention further enables the circuit 30 to be embodied using bipolar transistors of a single conductivity type. Although the preferred conductivity type is NPN, the circuit 30 can also be embodied using PNP transistors. In addition, the invention is not limited to conventional bipolar transistors, but can be alternatively embodied using other transistors of single conductivity type, such as P-type Metal-Oxide-Semiconductor (PMOS), N-type Metal-Oxide-Semiconductor (NMOS), Gallium Arsenide (GaAs), High-Electron-Mobility Transistor (HEMT) or Heterojunction-Bipolar-Transistor (HBT).

Figure 3:
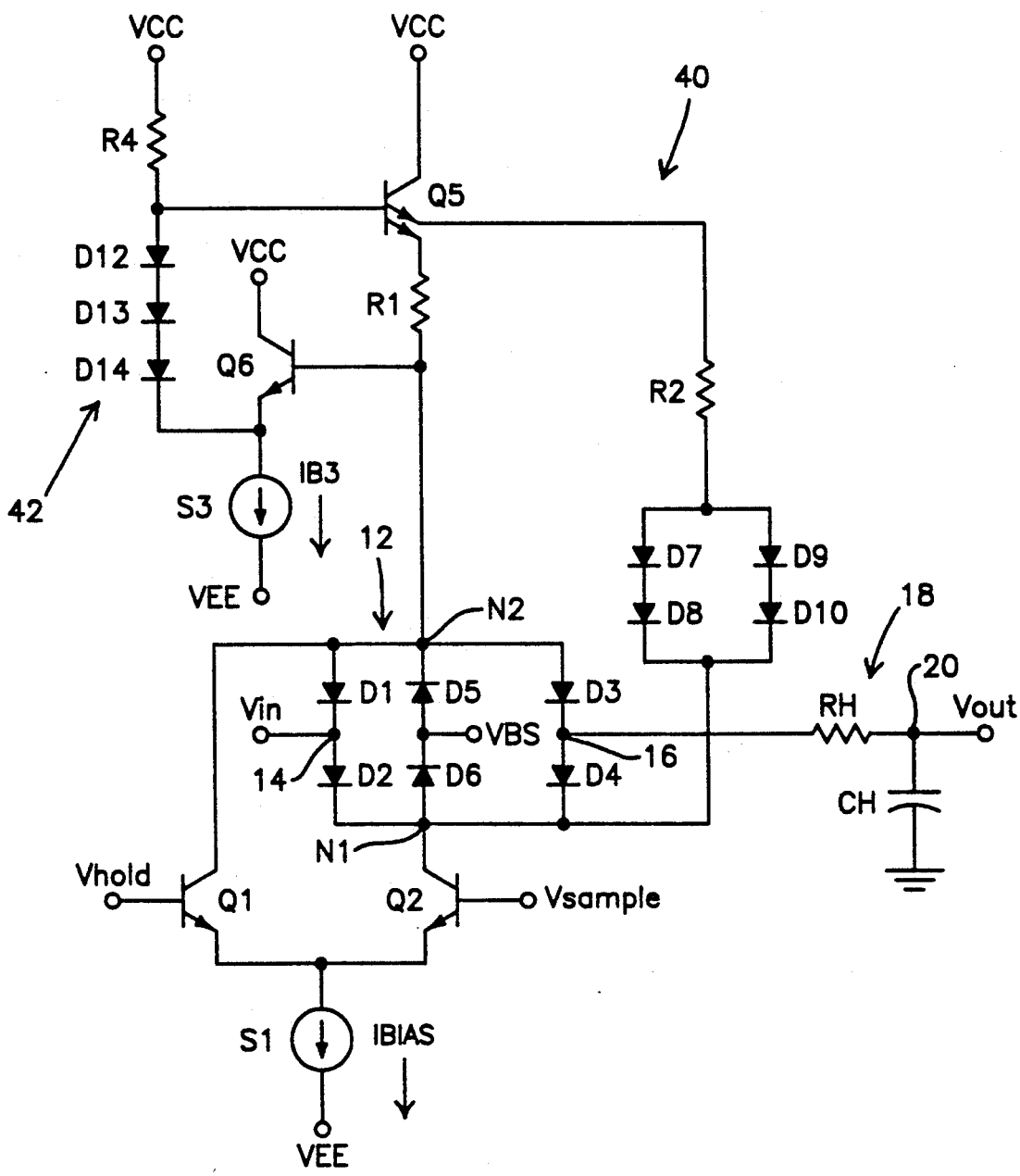

FIG. 3 illustrates another sample and hold circuit 40 embodying the invention in which the transistor Q3 of FIG. 2 is replaced by a dual emitter transistor Q5 having two emitters connected to the resistors R1 and R2 respectively and a collector connected to the voltage source VCC. A transconductance amplifier 42 includes an NPN bipolar transistor Q6 having an emitter connected to a constant current drain S3 which sinks a current IB3, a collector connected to the voltage source VCC and a base connected to the node N2. The emitter of the transistor Q6 is also connected through a series string of three diodes D12, D13 and D14 and a resistor R4 to the voltage source VCC. The junction of the resistor R4 and diode D12 is connected to the base of the transistor Q5.

In the circuit 40, the signal Vin is sensed at the node N2, rather than at the output 16 as in FIG. 2. The voltage at the node N2 in sampling mode is one diode drop above Vin = Vout, or Vout + Vbe. The voltage at the emitter of the transistor Q6 is one diode drop Vbe below the base voltage, or (Vout + Vbe) − Vbe = Vout. Due to the provision of the diodes D12, D13 and D14, the voltage at the base of the transistor Q5 is three diode drops Vbe above the voltage at the emitter of the transistor Q6, or Vout + 3 Vbe.

The voltage at the emitters of the transistor Q5 and at the upper ends of the resistors R1 and R2 is one diode drop Vbe below the base voltage of the transistor Q5, or Vout + 2 Vbe. The voltage at the node N2 and at the lower end of the resistor R1 is Vout + Vbe. The voltage drop across the resistor R1 is thereby maintained constant at (Vout + 2 Vbe) − (Vout + Vbe) = Vbe. The value of IBIAS/2 is selected to be equal to Vbe/RV. The current through the resistor R1 is thereby maintained constant at Vbe/RV = IBIAS/2.

As described above, the voltage at the junction of the resistor R2 and diodes D7 and D9 is also Vout + Vbe and the current through the resistor R2 is maintained constant at Vbe/RV = IBIAS/2. Thus, the bias currents supplied through the resistors R1 and R2 into the nodes N2 and N1 respectively are maintained constant, and resistive current source modulation is eliminated.

It will be understood that the dual emitter transistor Q5 can be replaced by a single transistor such as Q3 in FIG. 2, or by two transistors (not shown), and that the constant voltage drop across the resistors R1 and R2 can have values other than Vbe within the scope of the invention. It is also possible to sense the signal Vin at the node N1, at which the voltage is one diode drop below Vout in sampling mode, or at the input 14. Generally, the signal Vin can be sensed at any point in the bridge 12 for all embodiments of the invention.

Figure 4:
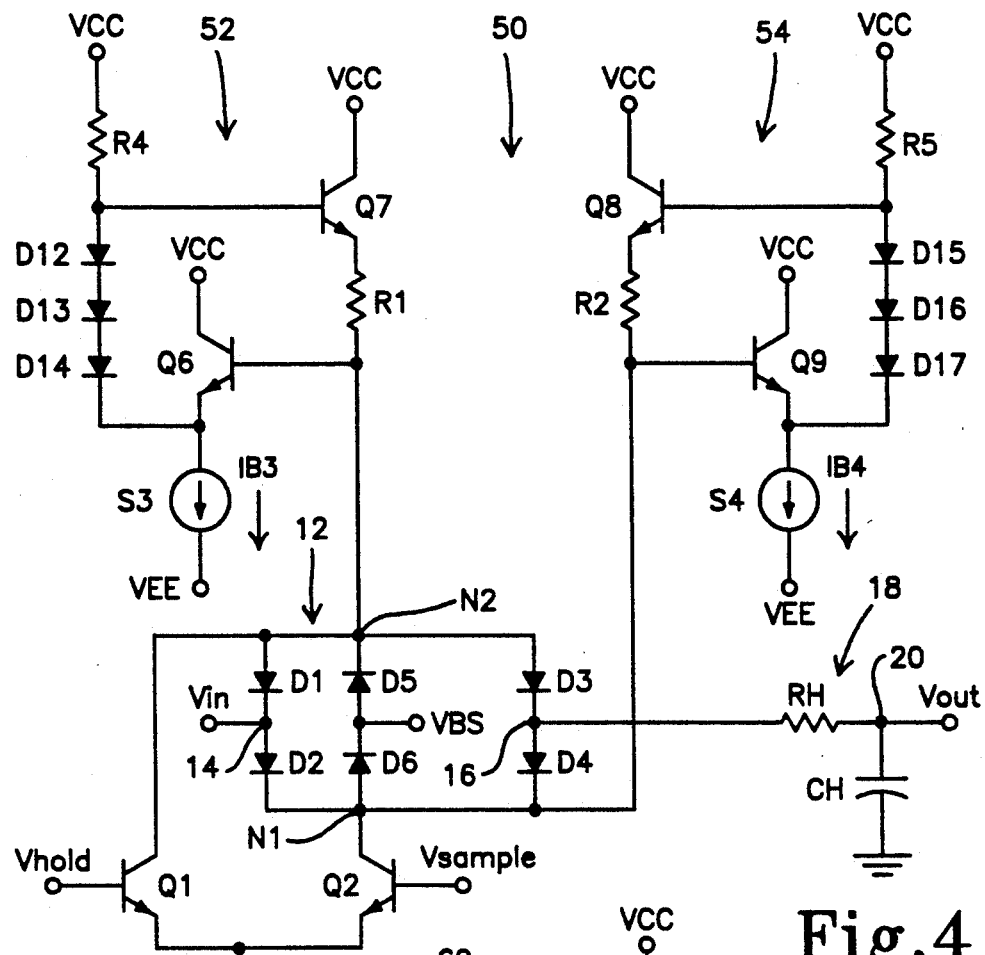

FIG. 4 illustrates another sample and hold circuit 50 including a first current regulator 52 which is similar to the regulator 42 of FIG. 3 except that it includes a transistor Q7 having only one emitter which is connected to the resistor R1. The regulator 52 regulates only the bias current flowing through the resistor R1 into the node N2 and operates in the manner described above.

A second current regulator 54 includes transistors Q8 and Q9, a resistor R5, diodes D15, D16 and D17 and a current drain S4 which sinks a current IB4=IB3, and are connected in the same arrangement as in the regulator 52 except that the base of the transistor Q9 is connected to the node N1.

The voltage at the node N1 and at the base of the transistor Q9 is Vout−Vbe. The voltage at the emitter of the transistor Q9 is Vout−2 Vbe, and the voltage at the base of the transistor Q8 is Vout+Vbe. The voltage at the emitter of the transistor Q8 (upper end of the resistor R2) is Vout, and the voltage at the node N1 (lower end of the resistor R2) is Vout−Vbe. The voltage drop across the resistor R2 is thereby maintained at Vout−(Vout−Vbe)=Vbe, the same as across the resistor R1.

Figure 5:
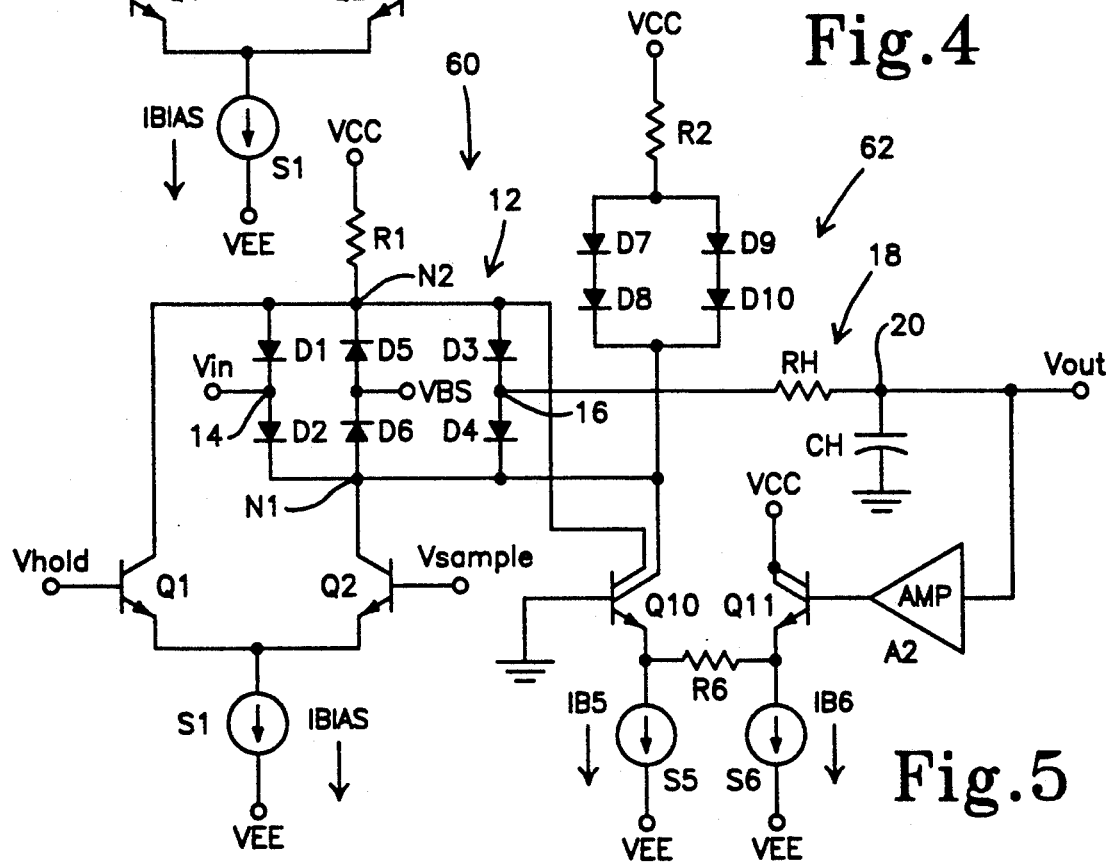
Figure 6:
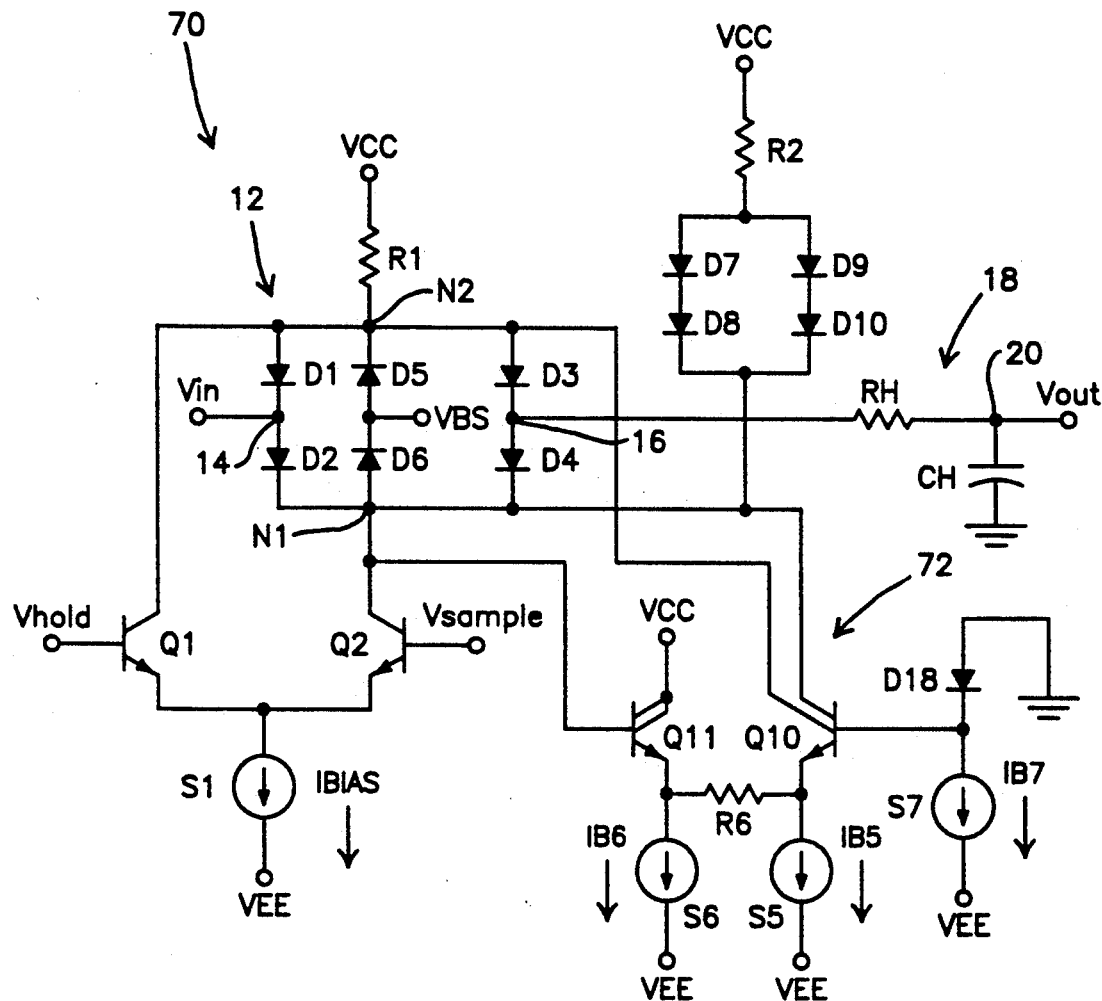
Figure 7:
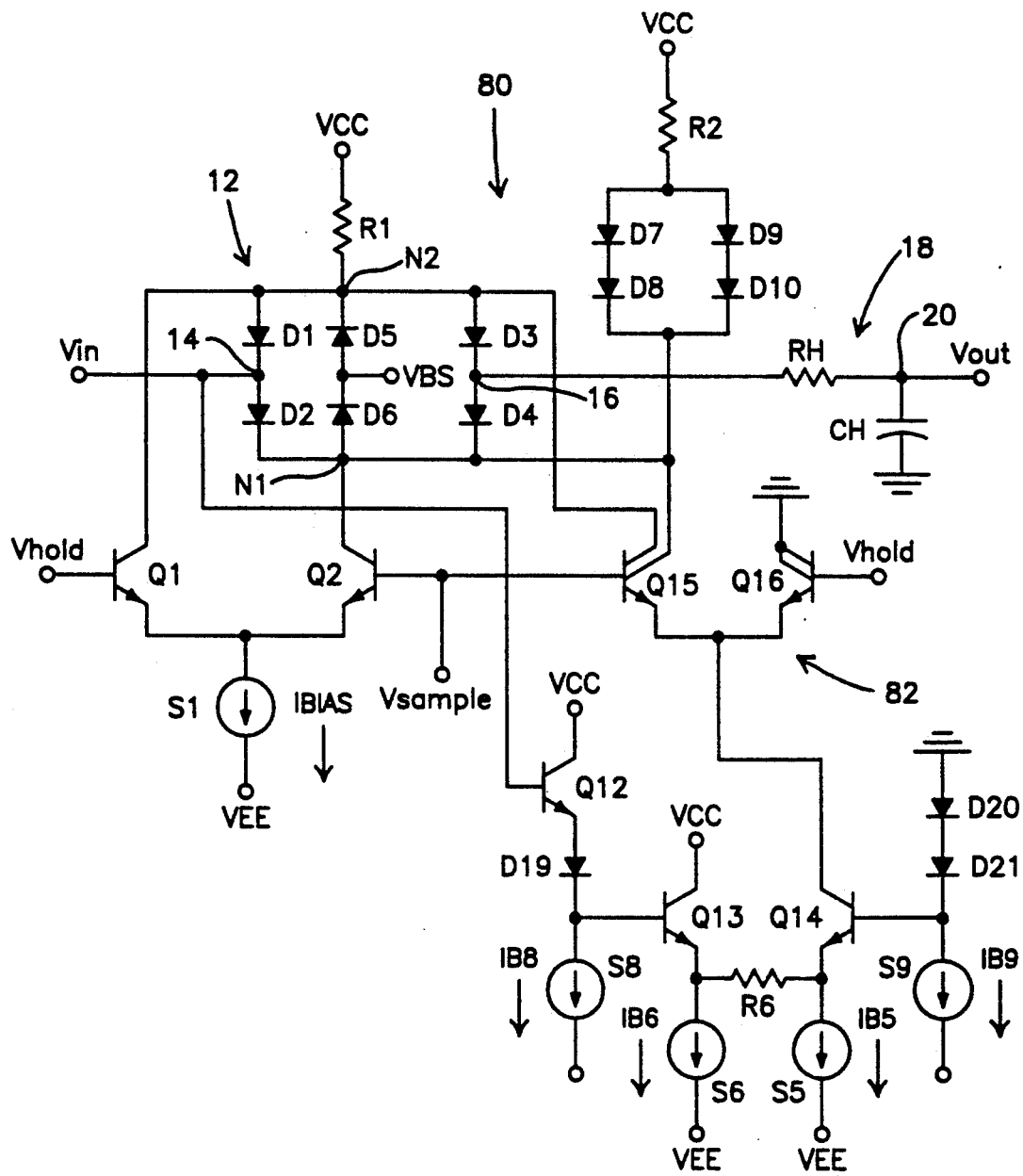

Whereas the current regulating transistors in the embodiments of the invention illustrated in FIGS. 2 to 4 are connected in series with the bridge 12, FIGS. 5 to 7 illustrate alternative embodiments in which the transistors are connected in parallel with the bridge 12. In all cases, the transistors are connected in series with the current source resistors R1 and R2.

A current regulator 62 of a sample and hold circuit 60 illustrated in FIG. 5 includes a dual collector transistor Q10 having two collectors connected to the nodes N1 and N2 respectively. The emitter of the transistor Q10 is connected to a constant current drain S5 which sinks a current IB5, and the base of the transistor Q10 is grounded.

Another dual collector transistor Q11 has two collectors connected to the voltage source VCC and an emitter connected to a constant current drain S6 which sinks a current IB6=IB5. The transistor Q11 functions as a transconductance amplifier. The emitters of the transistors Q10 and Q11 are interconnected by an emitter degeneration resistor R6 having a resistance of RV/2. A buffer amplifier A2 has an input connected to the junction 20 and an output connected to the base of the transistor Q11.

The current flowing into the nodes N2 and N1 through the resistors R1 and R2 respectively is IBIAS/2. With Vin=0, the current IB5 flowing through the transistor Q10 splits equally between the resistors R1 and R2, and the current flowing from each resistor R1 and R2 into the transistor Q10 is IB5/2. Thus, the total current flow through each resistor R1 and R2 is IBIAS/2+IB5/2.

Assuming that the signal Vin increases to an exemplary value of V1, the voltage drop across the resistors R1 and R2 will decrease by V1, and the current flowing into the nodes N2 and N1 through the resistors R1 and R2 respectively will decrease by $\Delta I = V1/RV$. However, the increased voltage Vout=V1 is also applied to the transistor Q11 through the amplifier A2, and since the resistance of the resistor R6 is RV/2, the current through the transistor Q11 will increase by $2\Delta I$. Since the transistors Q10 and Q11 are emitter-coupled through the resistor R6, the current through the transistor Q10 will decrease by $2\Delta I$.

The current flowing through each collector of the transistor Q10 will decrease by $\Delta I$ to a value of IB5/2−$\Delta I$. The current flowing into each node N2 and N1 through the respective resistor R1 and R2 is IBIAS/2+IB5/2−$\Delta I$. The current flowing out of each node N2 and N1 through the respective collector of the transistor Q10 is IB5/2−$\Delta I$. By summation, the current flowing into the bridge 12 through each node N1 and N2 must be IBIAS/2. The bias currents flowing through the resistors R1 and R2 into the bridge 12 are thereby maintained constant at IBIAS/2, and resistive current source modulation is eliminated.

FIG. 6 illustrates a modified embodiment of the circuit 60 which is designated as 70 and includes a current regulator 72. In the sample and hold circuit 70, the signal Vin is sampled at the node N1 rather than at the junction 20. More specifically, the base of the transistor Q11 is connected to the node N1. The base of the transistor Q10 is connected to a constant current drain S7 which sinks a current IB7. A level shifting diode D18 is connected between the base of the transistor Q10 and ground to compensate for the fact that the node N1 is one diode drop Vbe below Vin. The operation of the circuit 70 is essentially similar to that of the circuit 60.

FIG. 7 illustrates another sample and hold circuit 80 including a current regulator 82 which is similar to the circuits 60 and 70 in that the current regulating transistors are connected in parallel with the bridge 12. In this case, the signal Vin is sampled at the input 14. More specifically, a transistor Q12 has a base connected to the input 14, a collector connected to the voltage source VCC and an emitter connected through a level shifting diode D19 to a constant current drain S8 which sinks a current IB8. The junction of the diode D19 and drain S8 is connected to the base of a transistor Q13 which functions as a transconductance amplifier. The collector of the transistor Q13 is connected to the voltage source VCC, and the emitter of the transistor Q13 is connected to the junction of the drain S6 and the resistor R6.

The bias currents flowing through the resistors R1 and R2 into the nodes N1 and N2 is regulated by a transistor Q14 which is emitter-coupled with the transistor Q13 through the resistor R6. The base of the transistor is connected to a constant current drain S9 which sinks a current IB9, and also to ground through level shifting diodes D20 and D21 which compensate for the diode drops across the transistor Q12 and diode D19.

The collector of the transistor Q14 is connected to the emitters of dual-collector transistors Q15 and Q16. The collectors of the transistor Q15 are connected to the nodes N1 and N2 respectively, whereas the collectors of the transistor Q16 are connected to ground. The bases of the transistors Q15 and Q16 are connected to receive the sample and hold selection signals Vsample and Vhold respectively.

The operation of the circuit 80 is essentially similar to that of the circuits 60 and 70, except that the regulating current through the transistor Q14 is modulated by the signal Vin in holding mode. This is not a problem if the amplifier A1 (shown in FIG. 1), which is a low impedance voltage driver, is able to source the modulating current with the bridge 12 reverse biased. In this case, the transistors Q15 and Q16 can be omitted.

However, the transistors Q15 and Q16 are preferably provided to disconnect the transistor Q14 from the nodes N1 and N2 in holding mode and eliminate the modulation completely. In sampling mode, the transistor Q15 is turned on and the transistor Q16 is turned off such that the transistor Q14 provides the resistive current modulation compensation through the transistor Q15 as described above. In holding mode, the transistor Q15 is turned off, and the transistor Q16 is turned on to source the current IB5 required by the drain S5.

Figure 8:
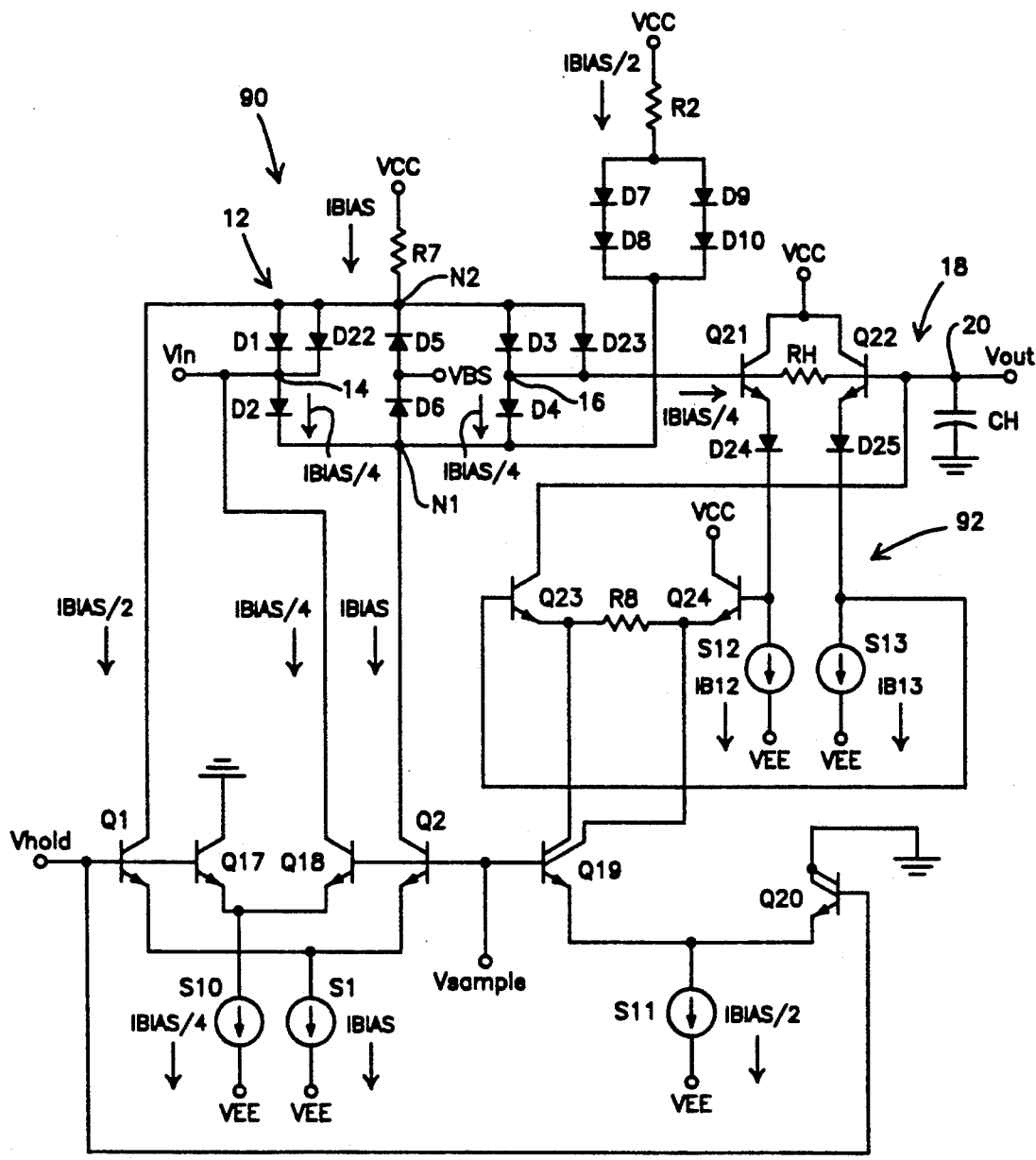
FIGS. 8 and 9 are electrical schematic diagrams illustrating alternative embodiments of a sample and hold circuit including compensation for output slew current modulation.
Figure 9:
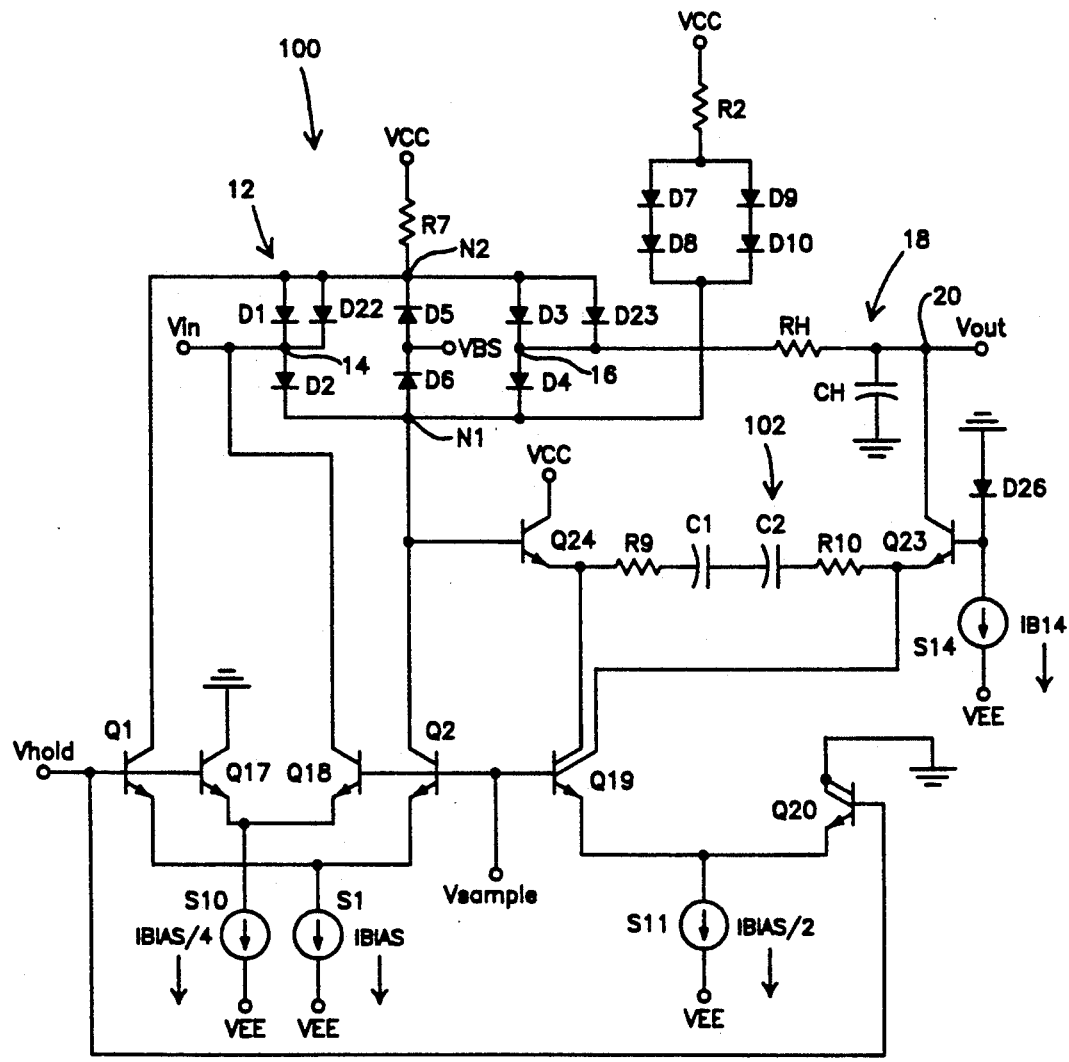

Whereas the sample and hold circuits illustrated in FIGS. 2 to 7 include current regulators which compensate for resistive current source modulation, the circuits illustrated in FIGS. 8 and 9 include regulators which compensate for output slew current modulation. In a sample and hold circuit 90 illustrated in FIG. 8, the resistor R1 is replaced by a resistor R7 which is designed to pass twice as much current (IBIAS), and has one-half the resistance (RV/2) of the resistor R1. The upper half of the bridge 12 is also required to pass twice as much current as in the previous embodiments, and for this reason diodes D22 and D23 are connected in parallel with the diodes D1 and D3 respectively.

A current regulator 92 includes a transistor Q17 having a collector connected to ground, a base connected to receive the hold selection signal Vhold and an emitter connected to a constant current drain S10 which sinks a current IBIAS/4. A transistor Q18 has a collector connected to the input 14, a base connected to receive the sample selection Vsample and an emitter connected to the drain S10.

The circuit 90 further includes a dual collector transistor Q19 having a base connected to receive the sample selection signal Vsample and an emitter connected to a constant current drain S11 which sinks a current IBIAS/2. A dual collector transistor Q20 has a base connected to receive the hold selection signal Vhold, two collectors connected to ground and an emitter connected to the drain S11.

A transistor Q21 has a base connected to the output 16, a collector connected to ground and an emitter connected through a level shifting diode D24 to a constant current source S12 which sinks a current IB12. A transistor Q22 has a base connected to the junction 20, a collector connected to ground and an emitter connected through a level shifting diode D25 to a constant current source S13 which sinks a current IB13=IB12.

A transistor Q23 has a base connected to the junction of the diode D25 and drain S13, a collector connected to the junction 20 and an emitter connected to a collector of the transistor Q19. A transistor Q24 has a base connected to the junction of the diode D24 and drain S12, a collector connected to VCC and an emitter connected to a collector of the transistor Q19. The emitters of the transistors Q23 and Q24 are interconnected by an emitter degeneration resistor R8 having the same resistance as the resistor RH.

In sampling mode, the transistors Q18 and Q19 are turned on and the transistors Q17 and Q20 are turned off. Assuming that the signal Vin is zero, a bias current of IBIAS/4 flows out of the input 14 through the transistor Q18 into the drain S10 and a bias current of IBIAS/4 flows out of the output 16 through the resistor RH and transistors Q23 and Q19 into the drain S11. In the manner described above, a bias current of IBIAS/2 flows through the resistor R2, node N1 and transistor Q2 into the drain S1. A bias current of IBIAS/4 flows through each of the diodes D2 and D4, node N1 and transistor Q2 into the drain S1. The bias current through the resistor R7 is IBIAS, and the bias current through each diode D1, D22, D3 and D23 is IBIAS/4.

The transistors Q21 and Q22 constitute a differential transconductance amplifier for sensing the voltage drop across the resistor RH. With the constant bias current IBIAS/4 flowing through the resistor RH, a voltage drop V2 across the resistor RH will have a constant value of $V2 = IBIAS/4 \times RH$, with the voltage at the base of the transistor Q21 being positive relative to the voltage at the base of the transistor Q22.

If the signal Vin increases, the current flow through the resistor RH will also attempt to increase by a value $\Delta I$. The change in current through the resistor RH which occurs as the result of a change in the signal Vin is known as an output slew current, and causes the voltage V2 to increase. The voltage at the base of the transistor Q24 will increase relative to the voltage at the base of the transistor Q23. Due to differential action and the fact that the resistor R8 has the same resistance as RH, the current flow through the transistor Q23 will decrease by $\Delta I$.

The current flowing through the resistor RH into the junction 20 attempts to increase by $\Delta I$. However, the current flowing out of the junction 20 through the transistor Q23 decreases by $\Delta I$. The effect is equivalent to the transistor Q23 sourcing a current into the junction 20 which is equal to the output slew current flowing into the junction 20 through the resistor RH. The net result is that the bias current flowing from the output 16 of the bridge 12 into the resistor RH remains constant at IBIAS/4.

The operation is opposite to that described when the signal Vin decreases. Since the output bias current remains constant, the bridge 12 is not modulated by output slew current. The goal of compensation for output slew current modulation is thereby achieved.

In holding mode, the transistors Q17 and Q20 are turned on and the transistors Q18 and Q19 are turned off. The transistor Q18 disconnects the input 14 from the drain S10, and the transistor Q17 sources the current IBIAS/4 required by the drain S10.

Whereas the regulator 92 of FIG. 8 senses the output slew current at the junction 20 in a "feedback" configuration, FIG. 9 illustrates a modified sample and hold circuit 100 including a regulator 102 which senses the signal Vin at the node N1 in a "feedforward" configuration. The regulator 92 includes analog circuitry for computing the output slew current as function of the variation of the voltage signal. Like elements are designated by the same reference numerals used in FIG. 8.

The base of the transistor Q24 is connected to the node N1. The base of the transistor Q23 is connected to a constant current drain S14 which sinks a current IB14. A level shifting diode D26 is connected between the drain S14 and ground to compensate for the fact that the node N1 is one diode drop Vbe lower than the input 14.

Resistors R9 and R10, each having the same resistance as the resistor RH, and capacitors C1 and C2, each having the same capacitance as the capacitor CH, are connected in series between the emitters of the transistors Q23 and Q24. The resistor R9 and capacitor C1 constitute an emitter degeneration circuit for the transistor Q24 which replicates the resistor RH and capacitor CH. The resistor R10 and capacitor C2 constitute a similar emitter degeneration network for the transistor Q23.

As the signal Vin increases, the current flow through the transistor Q24 increases by an amount equal to the output slew current through the resistor RH due to the provision of the resistor R9 and C1. Due to differential action, the current through the transistor Q23 decreases by the same amount, thereby decreasing the current flow out of the junction 20 through the transistor Q23.

The effect of sourcing a current into the junction 20 which is equal to the output slew current flowing into the junction 20 through the resistor RH is the same as described above for the circuit 90. The net result is that the bias current flowing from the output 16 of the bridge 12 into the resistor RH remains constant at IBIAS/4. The operation is opposite to that described when the signal Vin decreases. It will be noted that the circuit 100 can be modified to sample the signal Vin at the input 14, node N2 or output 16.

The circuit 100 can also be modified to operate in a "degenerative resistance feedforward" configuration by omitting the resistor R10 and capacitors C1 and C2, and leaving only the resistor R9 connected between the emitters of the transistors Q23 and Q24. This will result in a more rapid change of output slew compensating current at the junction 20.

Figure 10:
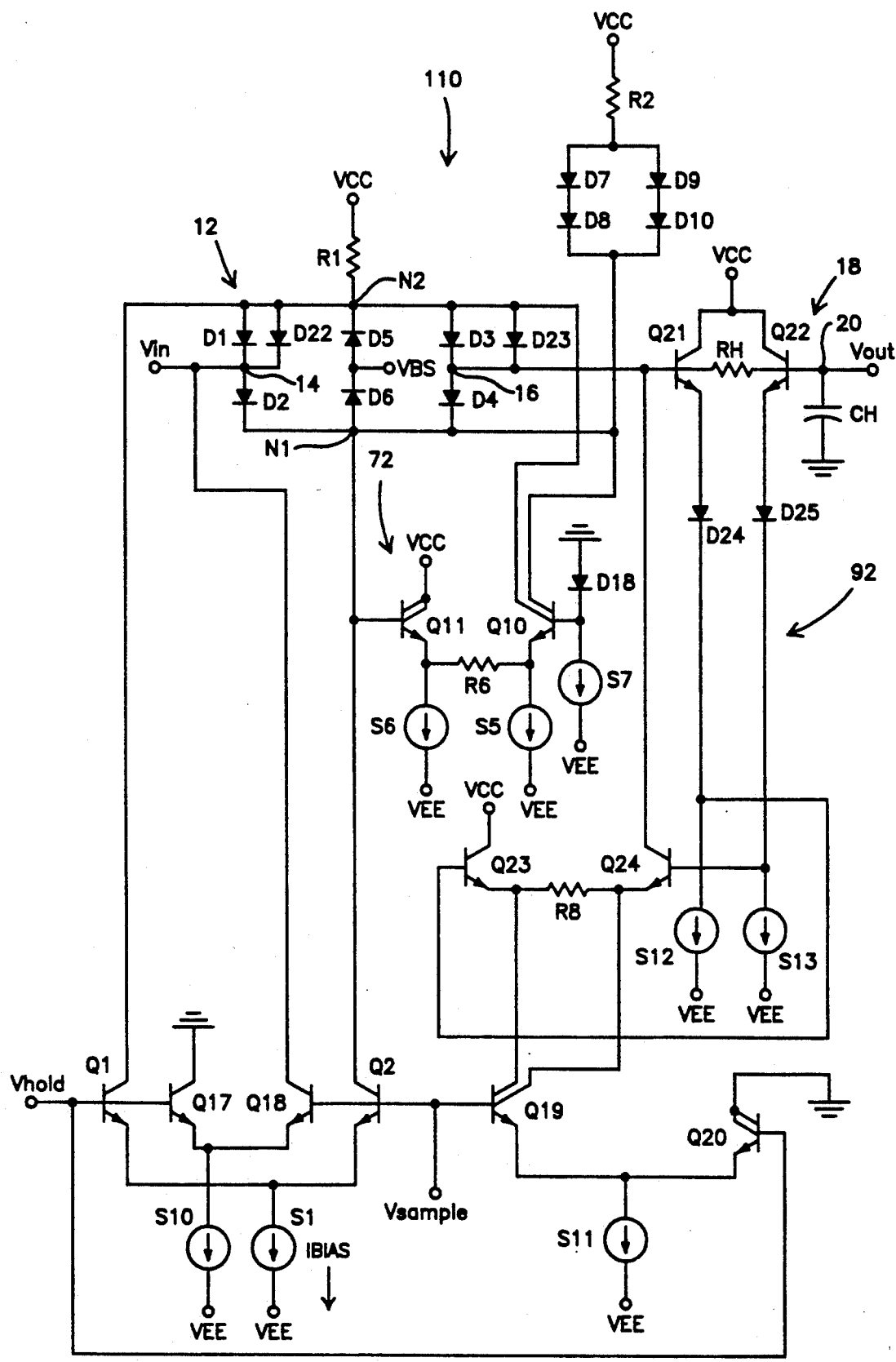
FIG. 10 is an electrical schematic diagram illustrating a sample and hold circuit including the resistive current source modulation of FIG. 6 and the output slew current modulation compensation of FIG. 8 in combination.

Since the resistive current source and output slew current modulation compensation regulators operate independently of each other, any of the embodiments of the two types of regulators can e combined to provide "full signal modulation compensation". FIG. 10 illustrates a sample and hold circuit 110 which includes the regulator 72 of FIG. 6 which provides resistive current source compensation in combination with the regulator 92 of FIG. 8 which provides output slew current compensation. The regulators 72 and 92 operate in the manner described above.

Figure 11:
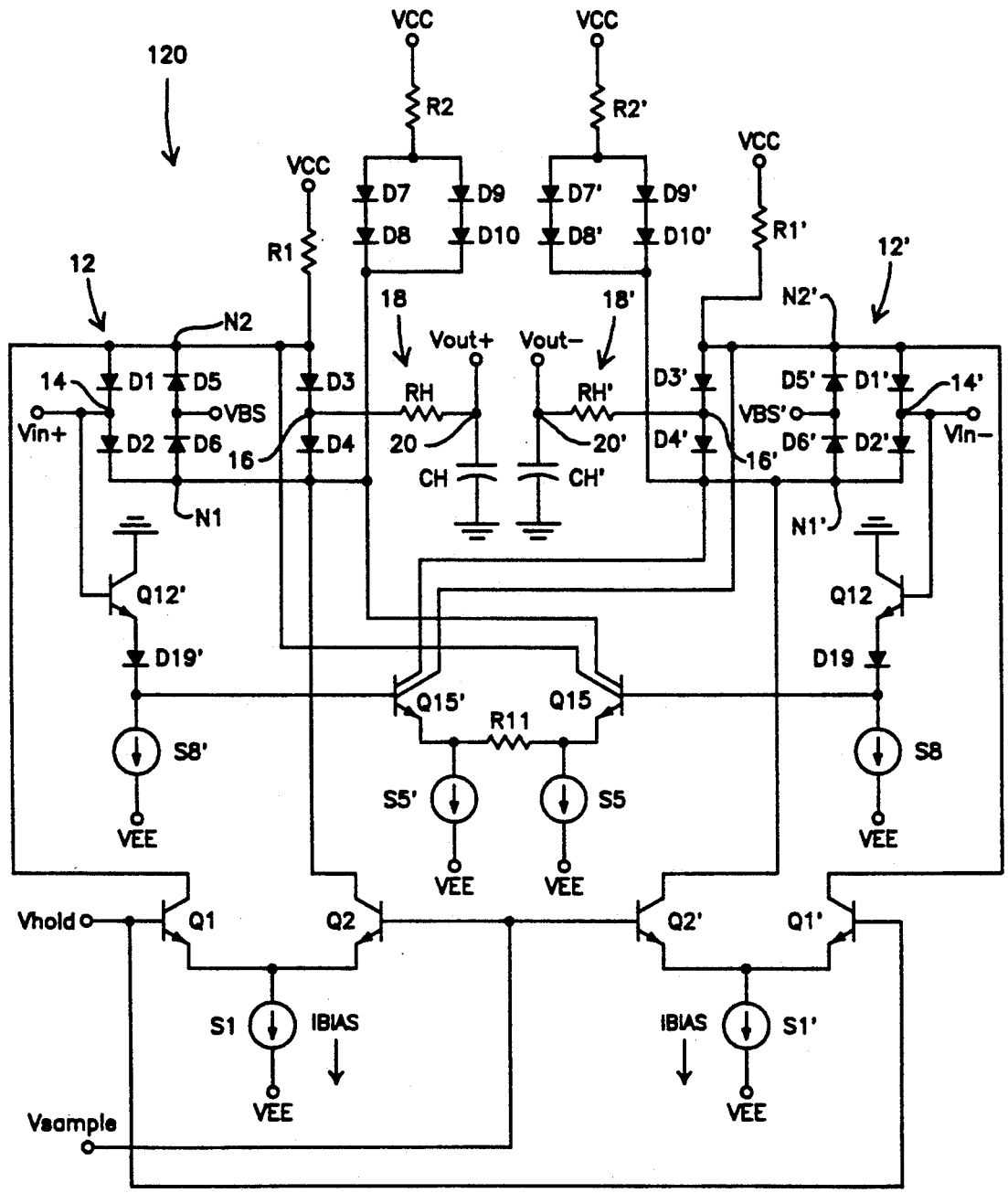
FIG. 11 is an electrical schematic diagram illustrating a sample and hold circuit including the resistive current source modulation arrangement of FIG. 7 in a differential configuration.

It is further within the scope of the invention to embody any of the sample and hold circuit configurations in differential, as well as single-ended class A mode. For example, FIG. 11 illustrates a sample and hold circuit 120 which is essentially similar to the circuit 80 of FIG. 7, but with differential architecture. Differential input signals Vin+ and Vin— are applied to the circuit 120, and differential output signals Vout+ and Vout— are derived therefrom. The half of the circuit 120 which processes the Vin+ and Vout+ signals includes elements designated by the same reference numerals used in FIG. 7. The half of the circuit 120 which processes the signals Vin— and Vout— includes elements designated by the same reference numerals primed.

The differential architecture enables the transistors Q13 and Q14 and associated elements to be eliminated, and the transistors Q15 and Q15' to be coupled in a differential configuration by an emitter degeneration resistor R11 having resistance RV. The inputs of the circuit halves are cross-coupled, with the base of the transistor Q12 connected to the input 14' and the base of the transistor Q12' connected to the input 14.

Since the transistors Q15 and Q15' are emitter coupled through the degeneration resistor R11, an increase in the voltage signal Vin+ and a corresponding decrease in the voltage signal Vin— causes the current through the transistor Q15 to decrease and the current through the transistor Q15' to increase by twice the amount the current flowing through each resistor R1, R2, R1' and R2' changes. This causes the current flowing through the resistors R1 and R2 into the nodes N2 and N1 to decrease and the current flowing through the resistors R1' and R2' into the nodes N2' and N1' to increase in the manner described above with reference to FIG. 7. The operation is opposite for an decrease in Vin+ and a corresponding increase in Vin—.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. A sample and hold circuit, comprising:
   voltage holding means;
   diode bridge means having an input for receiving a voltage signal, an output connected in circuit to the holding means, a first bias current node and a second bias current node;
   current drain means for causing a predetermined constant bias current to flow out of the bridge means;
   first current source means for supplying a first bias current into the first node;
   second current source means for supplying a second bias current into the second node;
   switch means for selectively connecting the first node to the drain means and disconnecting the second node from the drain means, thereby biasing the bridge means for coupling the input to the output for sampling; or connecting the second node to the drain means and disconnecting the first node form the drain means, thereby biasing the bridge means for uncoupling the input from the output for holding; and
   current regulator means responsive to the voltage signal for regulating at least one of said first and second bias currents to predetermined first and second constant values respectively in response to variation of the voltage signal; in which
   the first current source means comprises a first resistor connected between the first node and a voltage source means;
   the second current source means comprises a second resistor connected between the second node and the voltage source means; and
   the current regulator means comprises:
      transistor means having a current circuit and a control terminal, with said current circuit connected to induce respective currents through the first and second resistors; and
      control means responsive to the voltage signal for applying a control signal to the transistor means' control terminal to adjustably control the current flow through the transistor means' current circuit and thereby regulate said first and second bias currents to said first and second constant values respectively.

2. A circuit as in claim 1, in which the transistor means' current circuit is connected between said voltage source means and said first and second resistors, on the opposite side of said resistors from said bridge means.

3. A circuit as in claim 2, in which said transistor means has a single current circuit that is connected to both of said resistors.

4. A circuit as in claim 2, in which said transistor means has a dual current circuit with two current branches, with one current branch connected tot he first resistor and the other current branch connected to the second resistor.

5. A circuit as in claim 2, in which said transistor means comprises two transistors having respective current circuits that are connected respectively to said first and second resistors, and respective control terminals to which said control means applies respective control signals.

6. A circuit as in claim 1, in which the transistor means is coupled to the bridge means.

7. A circuit as in claim 1, in which the control means comprises transconductance amplifier means having an input responsive to the voltage signal and an output connected to adjustably control said current flow through the transistor means.

8. A circuit as in claim 1, in which the control means has an input connected to the output of the diode bridge means and an output connected to adjustably control said current flow through the transistor means.

9. A circuit as in claim 1, in which the control means has an input connected tot he input of the diode bridge means and an output connected to adjustably control said current flow through the transistor means.

10. A circuit as in claim 9, further comprising means for turning off the transistor means when the switch means connects the second node to the drain means and disconnects the first node from the drain means.

11. A circuit as in claim 1, in which the control means has an input connected to one of the first and second nodes and an output connected to adjustably control said current flow through the transistor means.

12. A circuit as in claim 1, in which:
the transistor means comprises:
a first transistor having an emitter and a collector connected in series with the first resistor between the voltage source means and the first node, and a base; and
a second transistor having an emitter and a collector connected in series with the second resistor between the voltage source means and the second node, and a base; and
the control means comprises:
first transconductance amplifier means having an input connected to the first node and an output connected to the base of the first transistor; and
second transconductance amplifier means having an input connected to the second node and an output connected to the base of the second transistor.

13. A sample and hold circuit, comprising:
voltage holding means;
diode bridge means having an input for receiving a voltage signal, an output connected in circuit to the holding means, a first bias current node and a second bias current node, said holding means comprising a resistor and a capacitor connected in series across the output of the bridge means;
current drain means for causing a predetermined constant bias current to flow out of the bridge means;
first current source means for supplying a first bias current into the first node;
second current source means for supplying a second bias current into the second node;
switch means for selectively connecting the first node to the drain means and disconnecting the second node from the drain means, thereby biasing the bridge means for coupling the input to the output for sampling; or connecting the second node to the drain means and disconnecting the first node from the drain means, thereby biasing the bridge means for uncoupling the input from the output for holding; and
current regulator means responsive to the voltage signal for regulating at least one of said first and second bias currents and the current flowing through said resistor to predetermined first, second and third constant values respectively in response to variation of the voltage signal; in which
said resistor and said capacitor define a junction therebetween; and
the current regulator means comprises;
third current source means connected to said junction; and
control means responsive to the voltage signal for adjustably controlling current flow through the third current source means and thereby regulating said current flowing through said resistor to said third constant value.

14. A circuit as in claim 13, in which the control means comprises transconductance amplifier means having an input responsive to the voltage signal and an output connected to adjustably control said current flow through the third current source means.

15. A circuit as in claim 13, in which the control means comprises means for sensing a slew current flowing through the resistor into said junction and controlling the third current source means to supply a regulating current into said junction which is substantially equal to said sensed slew current.

16. A circuit as in claim 13, in which the control means has an input responsive to the voltage signal and comprises;
computing means for computing a slew current flowing through the resistor into said junction as a predetermined function of said variation of the voltage signal; and
means for controlling the third current source means to supply a regulating current into said junction which is substantially equal to said computed slew current.

17. A circuit as in claim 16, in which the computing means comprises resistance means and capacitance means which substantially replicate the resistor and the capacitor.

18. A sample and hold circuit, comprising:
diode bridge means having an input for receiving a voltage signal, an output connected in circuit to the holding means, a first bias current node and a second bias current node;
current drain means for causing a predetermined constant bias current to flow out of the bridge means;
first current source means for supplying a first bias current into the first node;

second current source means for supplying a second bias current into the second node;

switch means for selectively connecting the first node to the drain means and disconnecting the second node from the drain means, thereby biasing the bridge means for coupling the input to the output for sampling; or connecting the second node to the drain means and disconnecting the first node form the drain means, thereby biasing the bridge means for uncoupling the input from the output for holding; and current regulator means responsive to the voltage signal for regulating at least one of said first and second bias currents to predetermined first and second constant values respectively in response to variation of the voltage signal, said switch means and current regulator means comprising bipolar transistors of a single conductivity type.

19. A sample and hold circuit, comprising:
voltage holding means;
switchable diode bridge means having an input for receiving a voltage signal, an output connected to supply a current to the holding means, a first bias current node through which a first bias current flows and a second bias current node through which a second bias current flows;

current regulator means for bootstrapping to the voltage signal at least one of said first and second bias currents and said current supplied from the diode bridge means output to the holding means, and thereby maintaining said first and second bias currents and said current supplied to the holding means at predetermined first, second and third constant values respectively;

a first current source resistor connected in circuit between the first node and a voltage source means; and a second current source resistor connected in circuit between the second node and the voltage source means;

in which the current regulator means comprises:
transistor means having a current circuit and a control terminal, with said current circuit connected to induce respective currents through the first and second resistors; and control means responsive to the voltage signal for applying a control signal to the transistor means' control terminal to adjustably control the current flow through the transistor means' current circuit and thereby regulate said first and second bias currents to said first and second constant values respectively.

20. A circuit as in claim 19, in which the transistor means' current circuit is connected between said voltage source means and said first and second resistors, on the opposite side of said resistors from said bridge means.

21. A circuit as in claim 19, in which the transistor means is coupled to the bridge means.

22. A circuit as in claim 19, in which the control means comprises transconductance amplifier means having an input responsive to the voltage signal and an output connected to adjustably control said current flow through the transistor means.

23. A sample and hold circuit, comprising:
voltage holding means;

switchable diode bridge means having an input for receiving a voltage signal, an output connected to supply a current to the holding means, a first bias current node through which a first bias current flows and a second bias current node through which a second bias current flows; and current regulator means for bootstrapping at least one of said first and second bias currents and said current supplied from the diode bridge means output to the holding means to the voltage signal, and thereby maintaining said first and second bias currents and said current supplied to the holding means at predetermined first, second and third constant values respectively;

said holding means comprising a resistor and a capacitor which are connected in series across the output of the bridge means and define a junction therebetween; and said current regulator means comprising:
third current source means connected to said junction; and control means for adjustable controlling current flow through the third current source means and thereby regulating said current flowing through said resistor to said third constant value.

24. A circuit as in claim 23, in which the control means comprises:
transistor means connected between said junction and a second voltage source means; and transconductance amplifier means having an input responsive to the voltage signal and an output connected to adjustably control current flow through the transistor means.

25. A circuit as in claim 23, in which the control means comprises means for sensing a slew current flowing through the resistor into said junction and controlling the third current source means to supply a regulating current into said junction which is substantially equal to said sensed slew current.

26. A circuit as in claim 23, in which the control means has an input responsive to the voltage signal and comprises;
computing means for computing a slew current flowing through the resistor into said junction as a predetermined function of said variation of the voltage signal; and means for controlling the third current source means to supply a regulating current into said junction which is substantially equal to said computed slew current.

27. A circuit as in claim 26, in which the computing means comprises resistance means and capacitance means which substantially replicate the resistor and the capacitor.

28. A sample and hold circuit, comprising:
voltage holding means;
switchable diode bridge means having an input for receiving a voltage signal, an output connected to supply a current to the holding means, a first bias current node through which a first bias current flow and a second bias current node through which a second bias current flows; and current regulator means for bootstrapping at least one of said first and second bias currents and said current supplied from the diode bridge means output to the holding means to the voltage signal, and thereby maintaining said first and second bias currents and said current supplied to the holding means at predetermined first, second and third constant values respectively, said current regulator means comprising bipolar transistors of a single conductivity type.

29. A differential sample and hold circuit comprising:
first voltage holding means;
first switchable diode bridge means having an input for receiving a first differential voltage signal, an output connected to the first holding means, a first bias current node through which a first bias current flows and a second bias current node through which a second bias current flows;
second voltage holding means;
second switchable diode bridge means having an input for receiving a second differential voltage signal, an output connected to the second holding means, a third bias current node through which a third bias current flows and a fourth bias current node through which a fourth bias current flows;
first current regulator means for bootstrapping at least one of said first bias current, said second bias current, and a fifth bias current flowing from the output of the first bridge means to the first holding means to said first voltage signal and thereby maintaining said first, second and fifth bias currents at predetermined first, second and fifth constant values respectively;
second current regulator means for bootstrapping at least one of said third bias current, said fourth bias current, and a sixth bias current flowing from the output of the second bridge means to the second holding means to said second voltage signal and thereby maintaining said third, fourth and sixth bias currents at predetermined third, fourth and sixth constant values respectively; and
circuit means for cross-coupling the input of the first bridge means to an input of the second current regulator means and the input of the second bridge means to an input of the first current regulator means.

30. A circuit as in claim 29, in which the first regulator current means and the second current regulator means comprise, in combination, a degeneratively coupled differential amplifier means.

* * * * *